(12) United States Patent
Zang et al.

(10) Patent No.: US 10,811,319 B2
(45) Date of Patent: Oct. 20, 2020

(54) MIDDLE OF LINE STRUCTURES

(71) Applicant: GLOBALFOUNDRIES INC., Grand Cayman (KY)

(72) Inventors: Hui Zang, Guilderland, NY (US); Ruilong Xie, Niskayuna, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/204,482

(22) Filed: Nov. 29, 2018

(65) Prior Publication Data
US 2020/0176324 A1 Jun. 4, 2020

(51) Int. Cl.
| | | |
|---|---|---|
| *H01L 21/8234* | (2006.01) | |
| *H01L 29/08* | (2006.01) | |
| *H01L 29/417* | (2006.01) | |
| *H01L 21/311* | (2006.01) | |
| *H01L 27/088* | (2006.01) | |
| *H01L 21/321* | (2006.01) | |
| *H01L 29/165* | (2006.01) | |
| *H01L 21/02* | (2006.01) | |
| *H01L 21/3105* | (2006.01) | |
| *H01L 21/027* | (2006.01) | |

(52) U.S. Cl.
CPC ........... *H01L 21/823475* (2013.01); *H01L 21/31116* (2013.01); *H01L 21/823418* (2013.01); *H01L 21/823431* (2013.01); *H01L 21/823437* (2013.01); *H01L 21/823468* (2013.01); *H01L 27/0886* (2013.01); *H01L 29/0847* (2013.01); *H01L 29/4175* (2013.01); *H01L 29/41791* (2013.01); *H01L 21/0274* (2013.01); *H01L 21/02532* (2013.01); *H01L 21/31053* (2013.01); *H01L 21/31144* (2013.01); *H01L 21/3212* (2013.01); *H01L 29/165* (2013.01)

(58) Field of Classification Search
CPC ..... H01L 21/823475; H01L 21/823418; H01L 27/0886; H01L 21/823431; H01L 21/823437; H01L 21/823468; H01L 29/41791; H01L 29/0847; H01L 21/31116; H01L 29/4175; H01L 21/3212; H01L 21/0274; H01L 29/165; H01L 21/31053; H01L 21/31144; H01L 21/02532
See application file for complete search history.

(56) References Cited

U.S. PATENT DOCUMENTS

| | | | |
|---|---|---|---|
| 9,209,305 B1* | 12/2015 | Zhang | H01L 29/41766 |
| 9,691,897 B2* | 6/2017 | Xie | H01L 21/76897 |
| 2014/0077305 A1 | 3/2014 | Pethe et al. | |
| 2015/0076609 A1* | 3/2015 | Xie | H01L 29/785 257/365 |
| 2015/0357425 A1* | 12/2015 | Liu | H01L 21/743 257/347 |

(Continued)

*Primary Examiner* — Victor A Mandala
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to middle of line structures and methods of manufacture. The structure includes: a plurality of gate structures; source and drain regions adjacent to respective gate structures of the plurality of gate structures; metallization features contacting selected source and drain regions; and recessed metallization features contacting other selected source and drain regions.

20 Claims, 16 Drawing Sheets

(56) References Cited

U.S. PATENT DOCUMENTS

| | | | |
|---|---|---|---|
| 2016/0126326 A1* | 5/2016 | Park | H01L 29/785 257/368 |
| 2016/0365424 A1* | 12/2016 | Basker | H01L 29/785 |
| 2018/0012839 A1* | 1/2018 | Zang | H01L 21/845 |
| 2019/0157405 A1* | 5/2019 | Huang | H01L 23/485 |
| 2019/0259667 A1* | 8/2019 | Zang | H01L 29/66795 |
| 2019/0393321 A1* | 12/2019 | Xu | H01L 29/6656 |
| 2020/0006329 A1* | 1/2020 | Lilak | H01L 27/0924 |
| 2020/0152749 A1* | 5/2020 | Zang | H01L 21/28079 |

\* cited by examiner

MIDDLE OF LINE STRUCTURES

FIELD OF THE INVENTION

The present disclosure generally relates to semiconductor structures and, more particularly, to middle of line structures and methods of manufacture.

BACKGROUND

Integrated circuit (IC) structures have middle of the line (MOL) contacts that connect the semiconductor devices to back end of the line (BEOL) metal levels. For example, a field effect transistor (FET) can have a gate contact (CB contact) which extends vertically through interlayer dielectric (ILD) material from a metal wire or via in the first back end of the line (BEOL) metal level ($M_0$) to the gate of the FET. The FET also has source/drain contacts (CA contacts) which extend vertically through the ILD material from metal wires or vias in the BEOL metal level to metal plugs (TS contacts), which are on the source/drain regions of the FET.

In order to avoid shorts between the gate contact and the metal plugs, the gate contact is formed on a portion of the gate that is offset from the active region of the FET and, more particularly, on a portion of the gate that extends laterally over the adjacent isolation region. Given the ever present need for size scaling of devices, it is advantageous to provide a gate contact formed on a portion of the gate directly above the active region (CB-over-active or CBoA), while still ensuring that the risk of a short developing between the gate contact and any of the metal plugs is avoided (or at least significantly reduced).

However, CBoA can have certain issues, with device performance being heavily impacted due to the CA and TS contacts. For example, the CA contacts to the source/drain (S/D) regions can provide a relatively high resistance, which degrades device performance. This relatively high resistance provided by the CA contacts occurs because of the recessing of the TS contacts. Additionally, recessed TS contacts can cause a higher spreading resistance throughout the device, which further degrades device performance.

SUMMARY

In an aspect of the disclosure, a structure comprises: a plurality of gate structures; source and drain regions adjacent to respective gate structures of the plurality of gate structures; metallization features contacting selected source and drain regions; and recessed metallization features contacting other selected source and drain regions.

In an aspect of the disclosure, a structure comprises: a gate structure comprising an active region; a gate contact contacting the gate structure; sidewall spacers surrounding the gate contact; source and drain regions adjacent to the gate structure; recessed metallization features in electrical contact with source and drain regions and adjacent to the gate structure; and contacts to the recessed metallization features.

In an aspect of the disclosure, a method comprising: forming a plurality of gate structures; forming source and drain regions adjacent to the plurality of gate structures; forming metallization features contacting the source and drain regions; recessing select metallization features; depositing a spacer material over the recessed metallization features; forming a gate contact to a gate structure of the plurality of gate structures which is between the recessed metallization features; and forming a source and drain contact to remaining metallization features.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to middle of line structures and methods of manufacture. More specifically, the present disclosure is directed to a self-aligned scaled gate contact over an active region (CBoA). For example, the present disclosure provides a scheme to only have recessed source/drain (S/D) metallization features around the CBoA region, with other metallization features not being recessed. Advantageously, by limiting the recessing to S/D metallization features which are around the CBoA region, the overall height of the S/D metallization features is increased, thereby reducing a spreading resistance provided by the metallization features, and also reducing a vertical resistance provided by the S/D contact to the metallization features.

In embodiments, the method comprises, for example: forming the gate and S/D contacts, e.g., middle of line (MOL) contacts; a deposition of an interlevel (ILD) layer and a dielectric capping layer after the formation of the S/D metallization features (TS contacts); a lithography and reactive ion etching (RIE) to form a recess for the gate contact (CB contact); a recessing of the metal of the TS contact which is around the CBoA region; a deposition of a dielectric spacer material to fully pinch-off the recess of the recessed TS region; an etching of the dielectric spacer material which stops on the gate cap to form spacers; an etching of the gate cap to expose the gate material; an etching to form a recesses for the S/D contact (CA contact); and a metallization to form contacts to the S/D regions and gate structures. In embodiments, the structure comprises, for example: dielectric spacers on sidewalls of a CB gate contact; and a dielectric pinch-off in the TS contact recess. The dielectric spacers isolate the gate contact from source and drain contacts.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
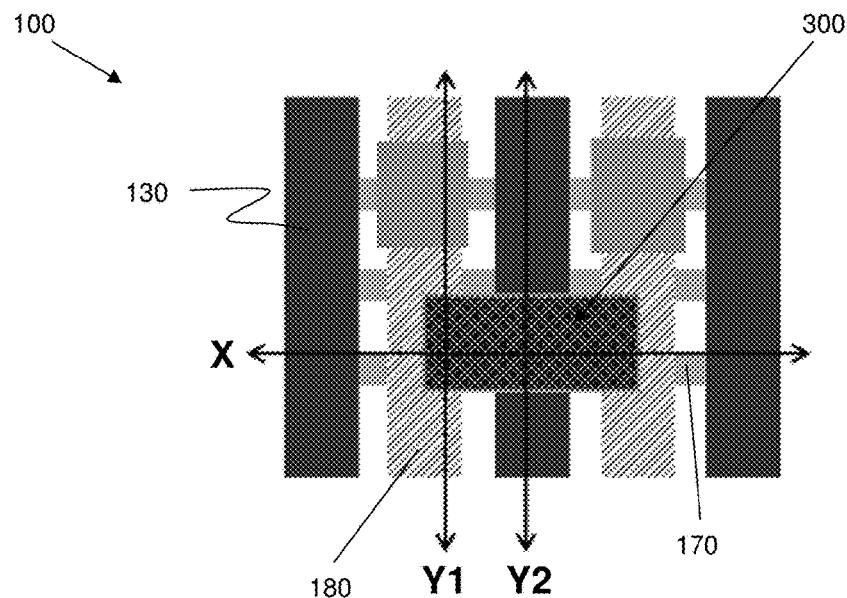
FIGS. 1A-1D show gate structures, amongst other features, and respective fabrication processes in accordance with aspects of the present disclosure.
Figure 1B:
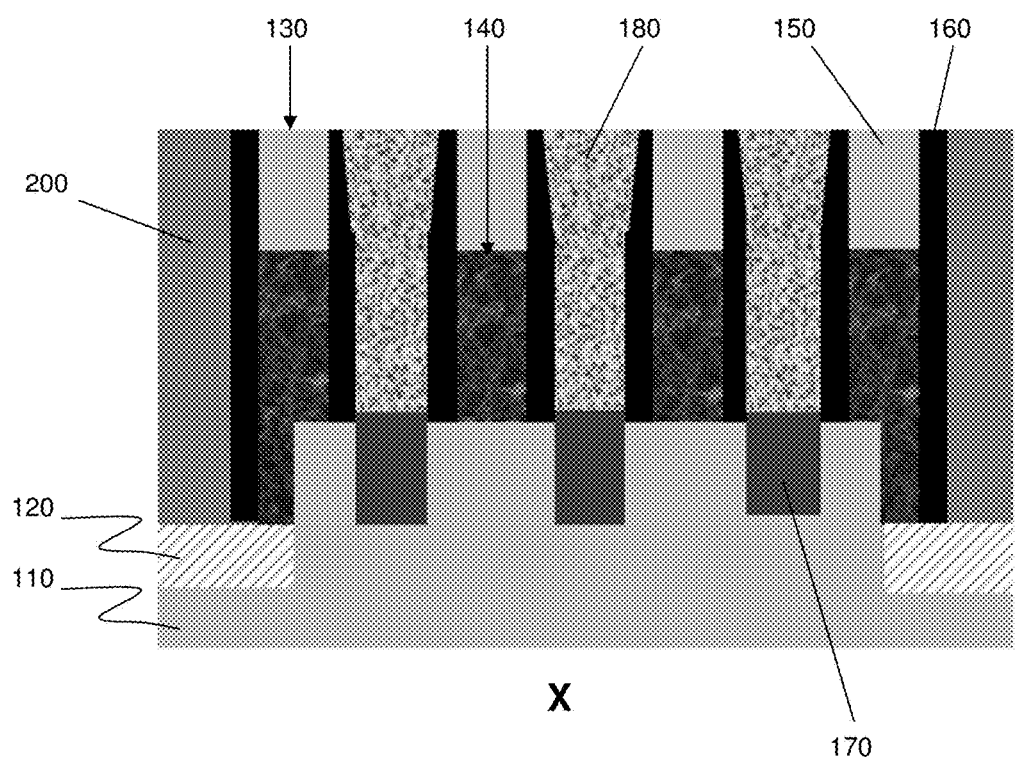
Figure 1C:
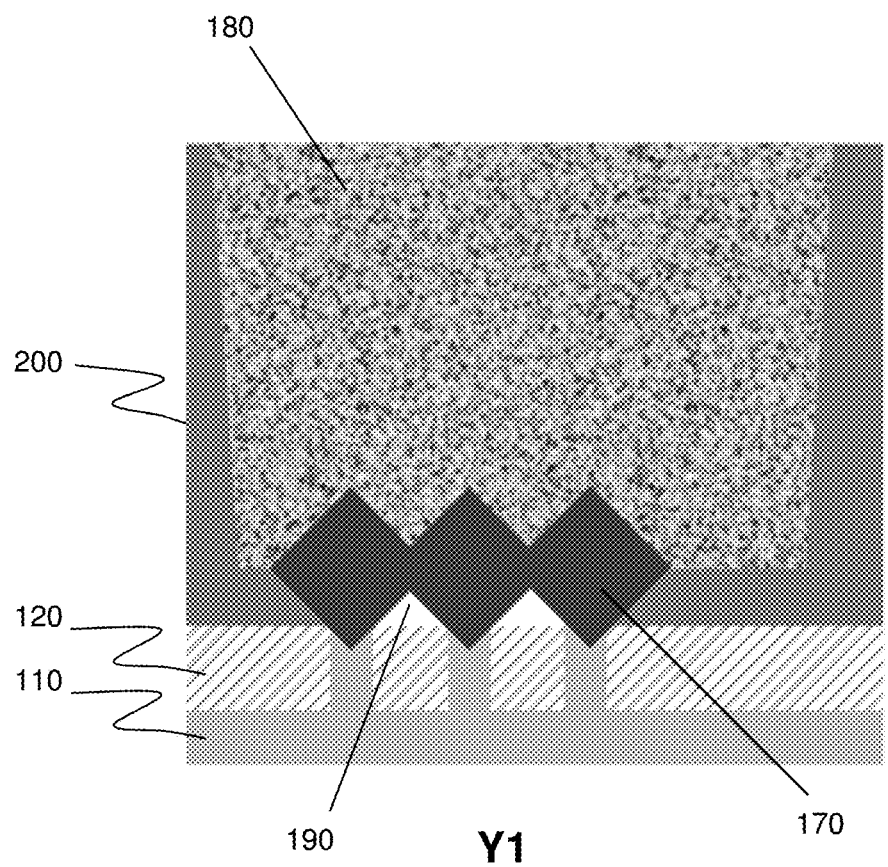
Figure 1D:
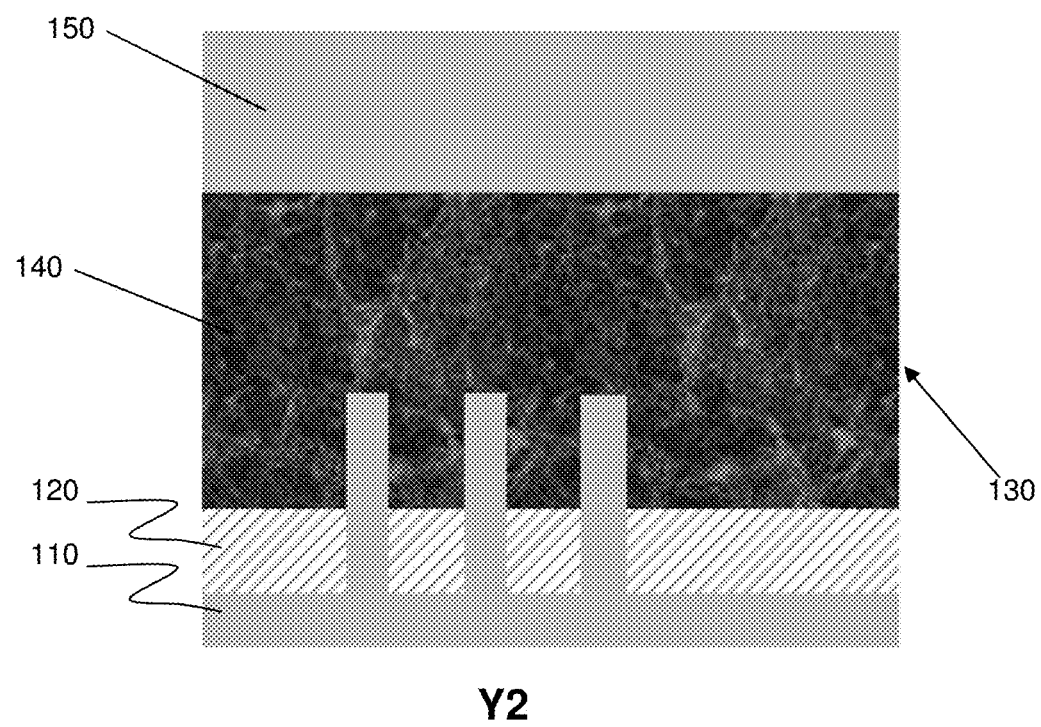

FIGS. 1A-1D show an incoming structure and respective fabrication processes in accordance with aspects of the present disclosure. More specifically, FIG. 1A shows a top view of a structure 100, while FIG. 1B shows a cross-sectional view in an X-axis direction, FIG. 1C shows a cross-sectional view in a Y1-axis direction and FIG. 1D shows a cross-sectional view in a Y2-axis direction. The structure 100 comprises an active region, which can form a device, e.g., a transistor. More specifically, the active region will have a gate contact over an active region, forming CBoA 300. The structure 100 further comprises a substrate 110 composed of a suitable semiconductor material. For example, the substrate 110 may be composed of any suitable material including, but not limited to, Si, SiGe, SiGeC, SiC, GaAs, InAs, InP, and other III/V or II/VI compound semiconductors.

In embodiments, the substrate 110 can be representative of a fin structure (for finFET devices) formed using a conventional sidewall image technique or other conventional lithography and etching processes. In the SIT technique, for example, a mandrel, e.g., $SiO_2$, is deposited on the substrate 110 using conventional chemical vapor deposition (CVD) processes. A resist is formed on the mandrel material and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped.

Shallow trench isolation (STI) structures 120 are formed in the substrate 110 to isolate a plurality of gate structures 130. In embodiments, the STI structures 120 can be formed by conventional lithography, etching and deposition methods known to those of skill in the art. For example, a resist formed over substrate 110 is exposed to energy (light) to form a pattern (opening). An etching process with a selective chemistry, e.g., RIE, will be used to form one or more trenches in the substrate 110 through the openings of the resist. The resist can then be removed by a conventional oxygen ashing process or other known stripants. Following the resist removal, an insulator material, e.g., oxide, can be deposited by any conventional deposition processes, e.g., CVD processes. Any residual material on the surface of the substrate 110 can be removed by conventional chemical mechanical polishing (CMP) processes.

Still referring to FIGS. 1A-1D, a plurality of gate structures 130 are formed on the substrate 110. In embodiments, the plurality of gate structures 130 are formed by conventional gate last processes or gate first processes. For example, in the gate first processes, the fabrication includes the deposition of gate materials 140, e.g., deposition of dielectric material and gate metal(s) (e.g., workfunction metals), and a gate cap 150, followed by a patterning process. In embodiments, the dielectric material of the gate materials 140 can be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate metals of the gate materials 140 can include any workfunction metal or any combination of metals, depending on the particular application and design parameters used for NFET or PFET devices, e.g., tungsten. The capping material for the gate gap 150 can be, e.g., SiN. Sidewall spacers 160, e.g., a SiOCN material, are deposited on the sidewalls of the patterned gate structures 130 and gate cap 150 using a conventional deposition process, e.g., chemical vapor deposition (CVD), followed by an anisotropic etching process.

FIGS. 1A-1D further show source and drain regions (S/D) regions 170 formed on the substrate 110, adjacent to the sidewall spacers 160. More specifically, the structures and processes described herein provide for forming source and drain regions 170 adjacent to the plurality of gate structures 130. The S/D regions 170 can be raised epitaxial source and drain regions formed by an epitaxial growth process, e.g., doped with boron or phosphorous. More specifically, the S/D regions 170 can be epitaxial Si material doped with phosphorous for a NFET or epitaxial SiGe material doped with boron for a PFET. Spaces 190 are formed between the S/D regions 170 because of pinch-off.

In embodiments, the S/D regions 170 can include silicide regions. As should be understood by those of skill in the art, the silicide process begins with deposition of a thin transition metal layer, e.g., nickel, cobalt or titanium, over fully formed and patterned semiconductor devices (e.g., doped or ion implanted S/D regions 170). After deposition of the material, the structure is heated, allowing the transition metal to react with exposed silicon (or other semiconductor material as described herein) in the active regions of the semiconductor device (e.g., S/D regions 170) forming a low-resistance transition metal silicide. Following the reaction, any remaining transition metal is removed by chemical etching, leaving silicide contacts in the active regions of the device, e.g., S/D regions 170. It should be understood by those of skill in the art that silicide contacts will not be required on the metal gate structures.

A contact metal for a source/drain (S/D) metallization feature 180 (e.g., metal plug (TS contact)) is deposited on the silicide of the S/D regions 170. In embodiments, the contact metal for the S/D metallization feature 180 can be any suitable metal material used for a lower source/drain contact. For example, the contact metal for the S/D metallization feature 180 can be, e.g., tungsten, cobalt, ruthenium, copper, or any other suitable conductive material. The contact metal of the S/D metallization feature 180 is recessed by a selective timed etching process, e.g., maskless process. The structures described herein are surrounded by an interlevel dielectric (ILD) layer 200, e.g., oxide material.

Figure 2A:
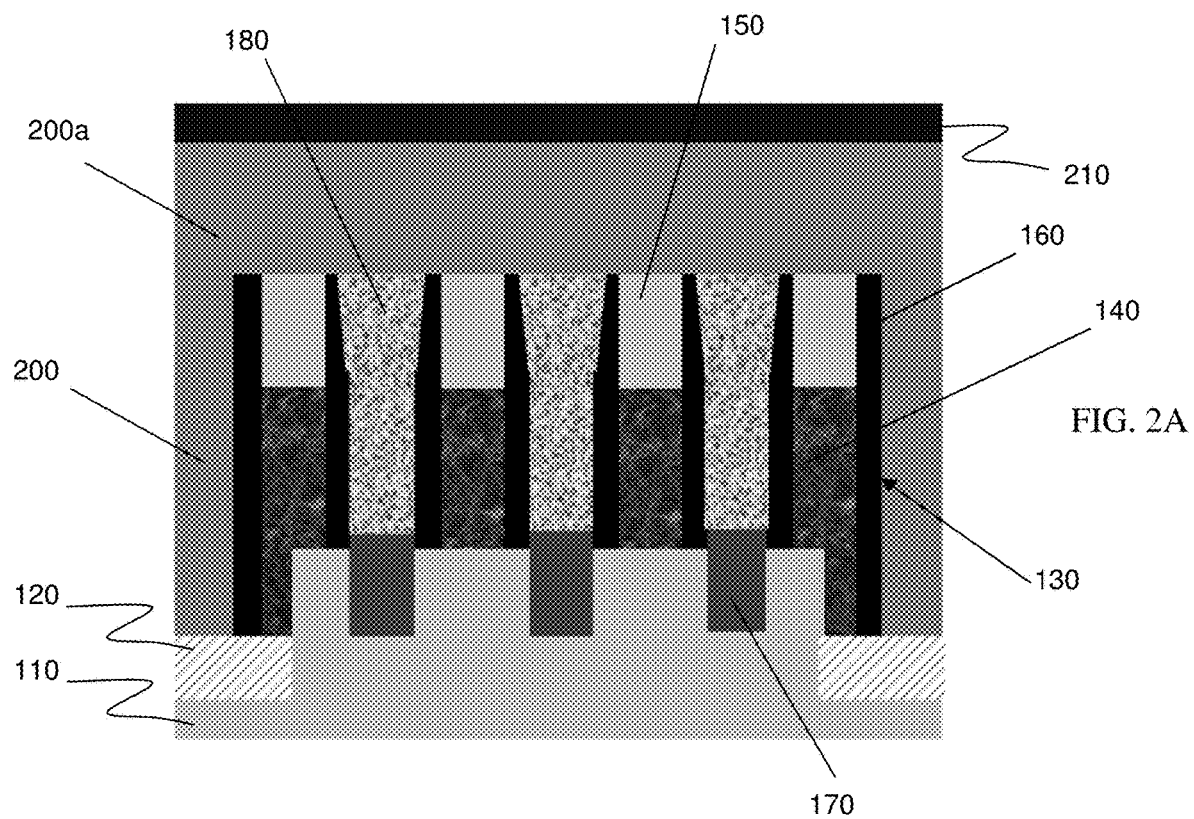
FIGS. 2A-2C show a dielectric cap, amongst other features, and respective fabrication processes in accordance with aspects of the present disclosure.
Figure 2B:
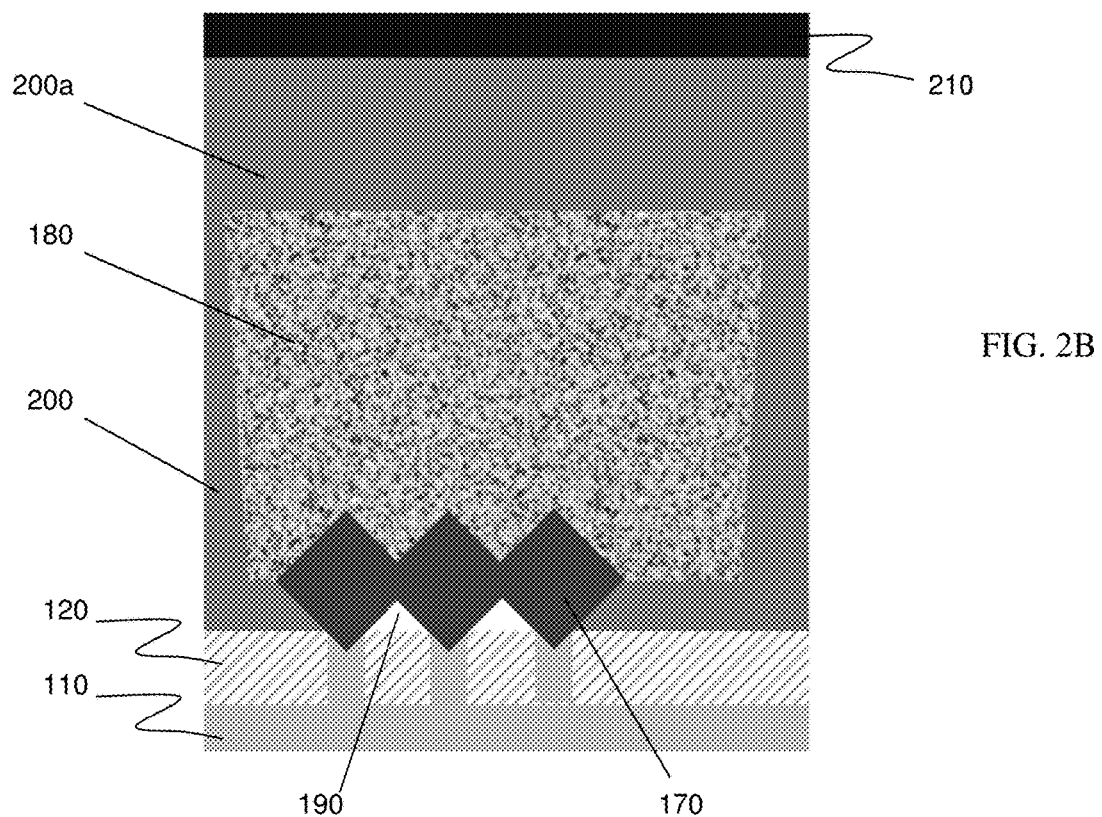
Figure 2C:
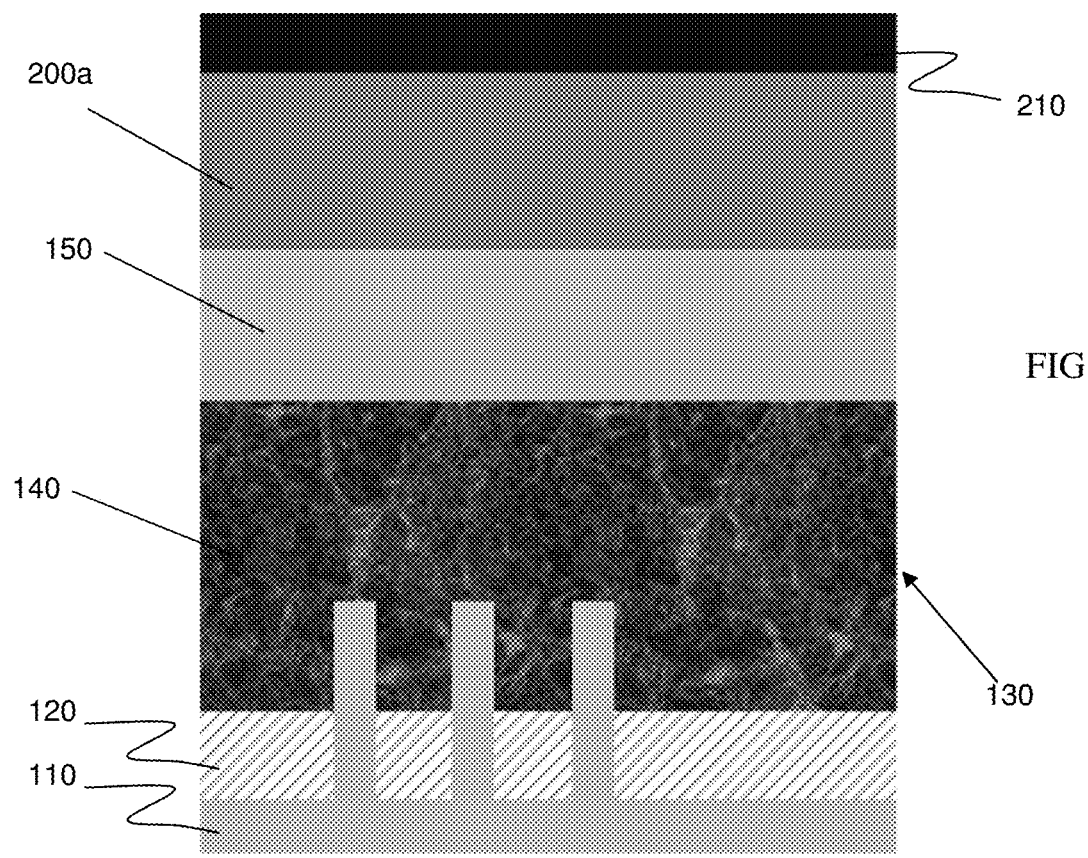

FIGS. 2A-2C show the deposition of an ILD layer 200a and a capping layer 210 over the gate structures 130. In embodiments, the ILD layer 200a can be comprised of any suitable dielectric material, e.g., oxide, deposited by a CVD process. The deposition of the ILD layer 200a is followed by a CMP process. The capping layer 210 can be comprised of any suitable dielectric material, e.g., oxide, deposited by a CVD process. The deposition of the capping layer 210 is followed by a CMP process.

Figure 3A:
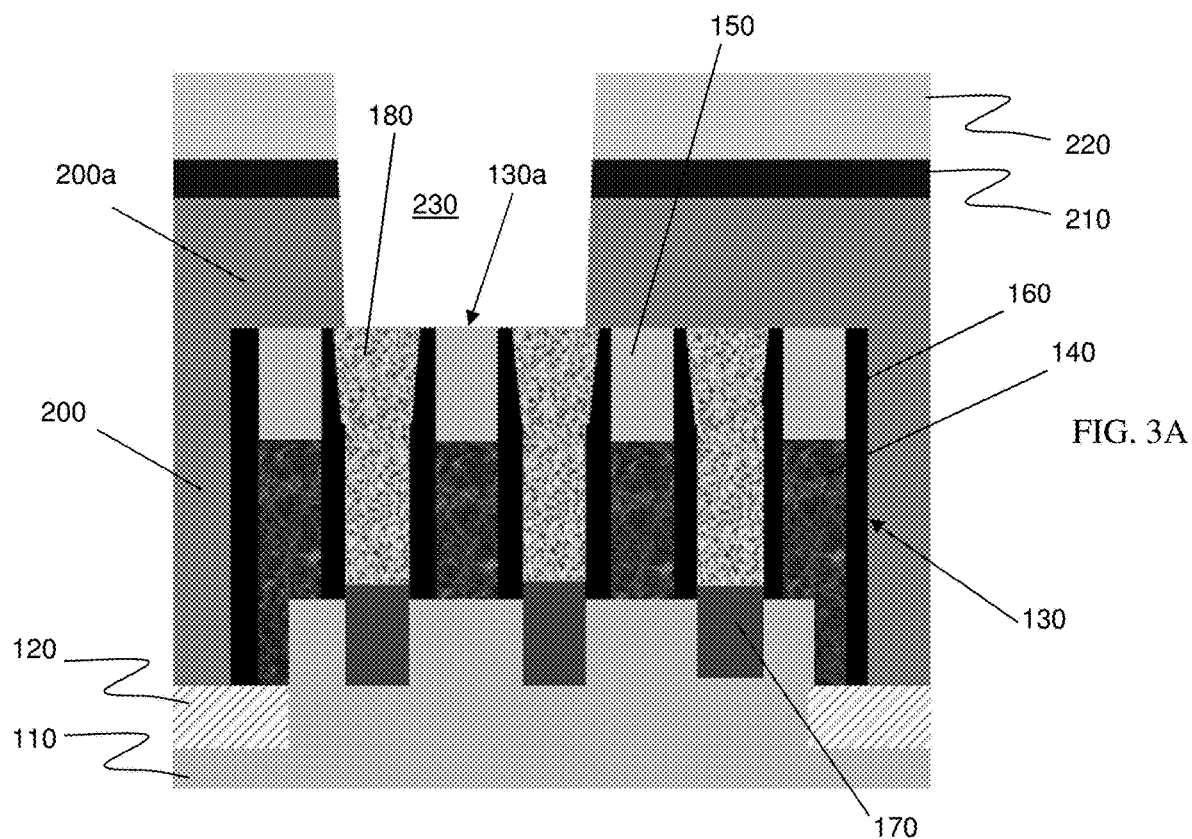
FIGS. 3A-3C show recesses, amongst other features, and respective fabrication processes in accordance with aspects of the present disclosure.
Figure 3B:
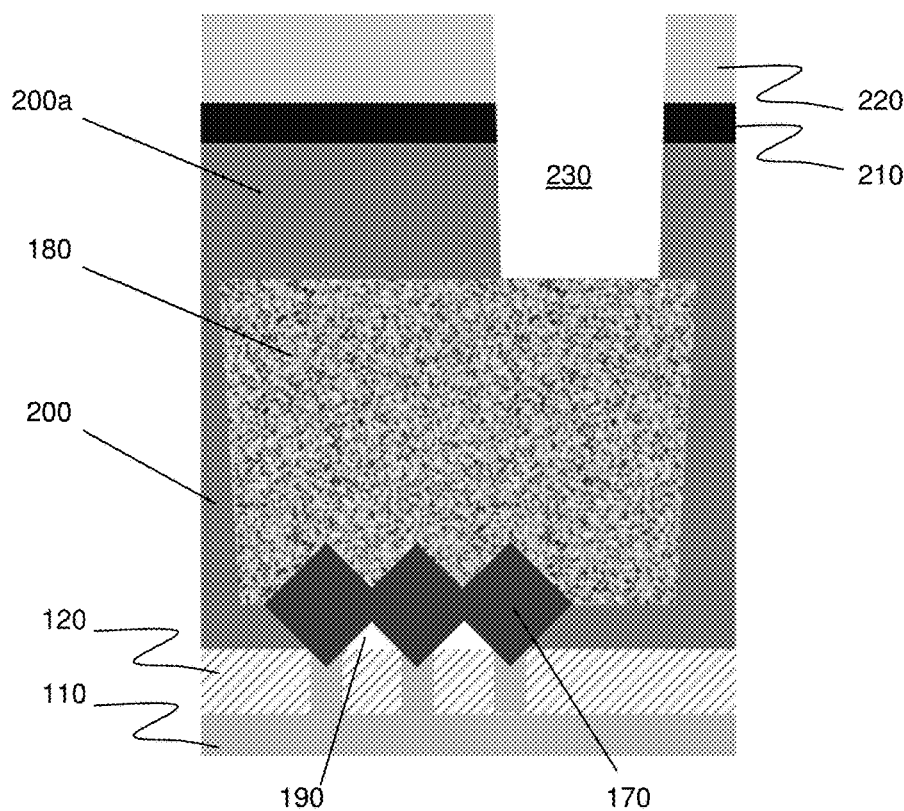
Figure 3C:
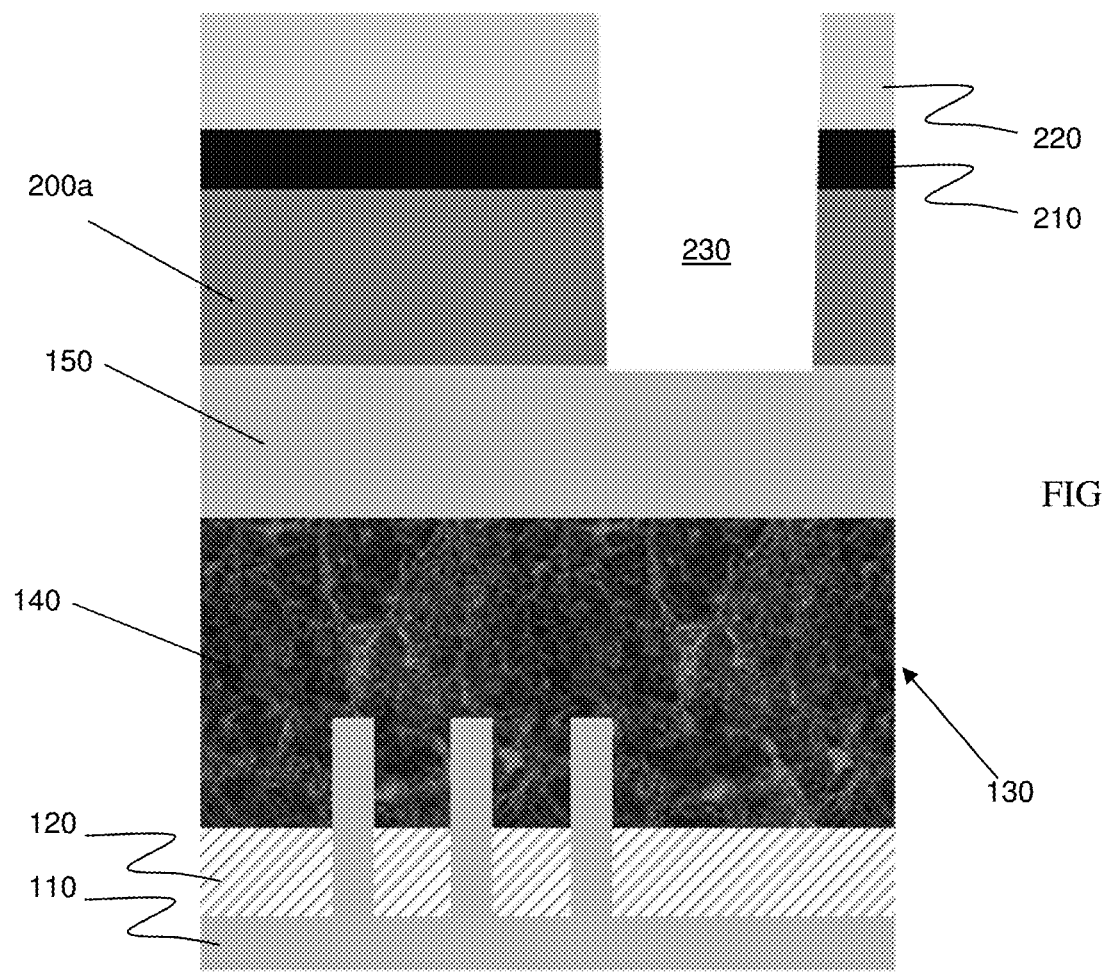

FIGS. 3A-3C show cross-sectional views of an opening for a gate contact, amongst other features, and respective fabrication processes in accordance with aspects of the present disclosure. In embodiments, a photoresist 220 is formed over the capping layer 210. The photoresist 220 is exposed to energy (light) to form a pattern (opening). An etching process with a selective chemistry, e.g., RIE process, will be used to form one or more trenches 230 in the capping layer 210 and the ILD layer 200a through the openings of the photoresist 220, exposing the gate cap 150 of a select gate structure 130a.

Figure 4A:
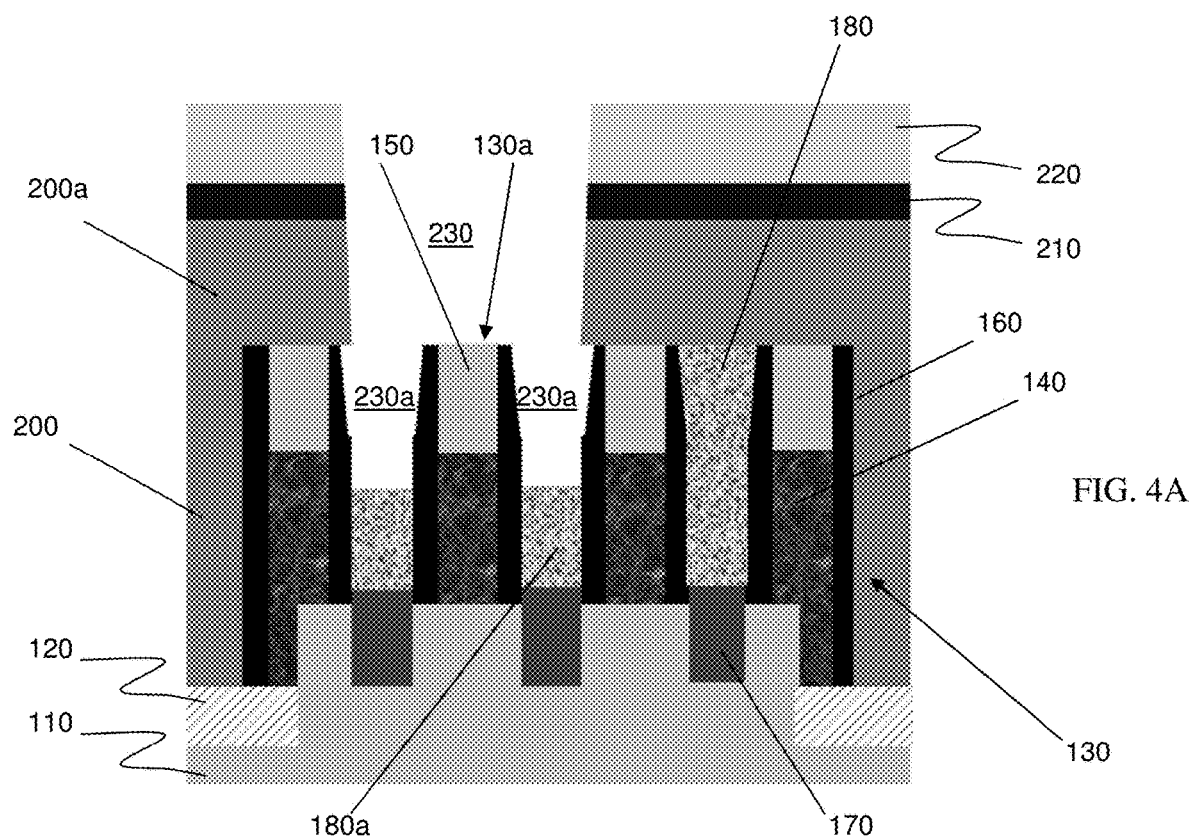
FIGS. 4A-4C show recessed metallization features, amongst other features, and respective fabrication processes in accordance with aspects of the present disclosure.
Figure 4B:
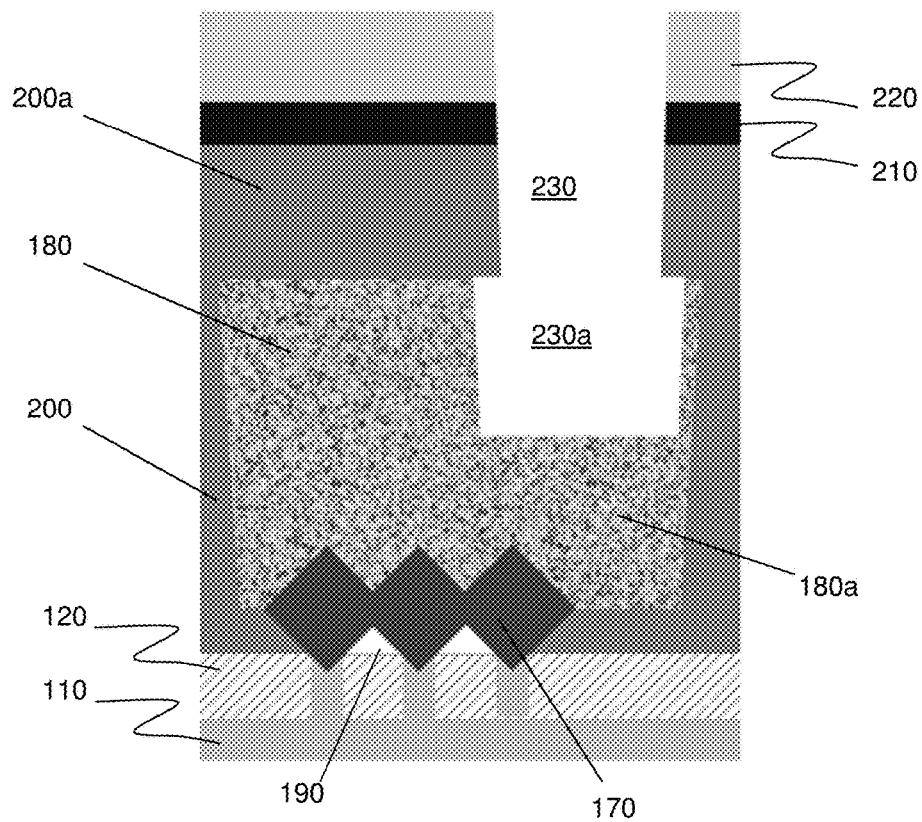
Figure 4C:
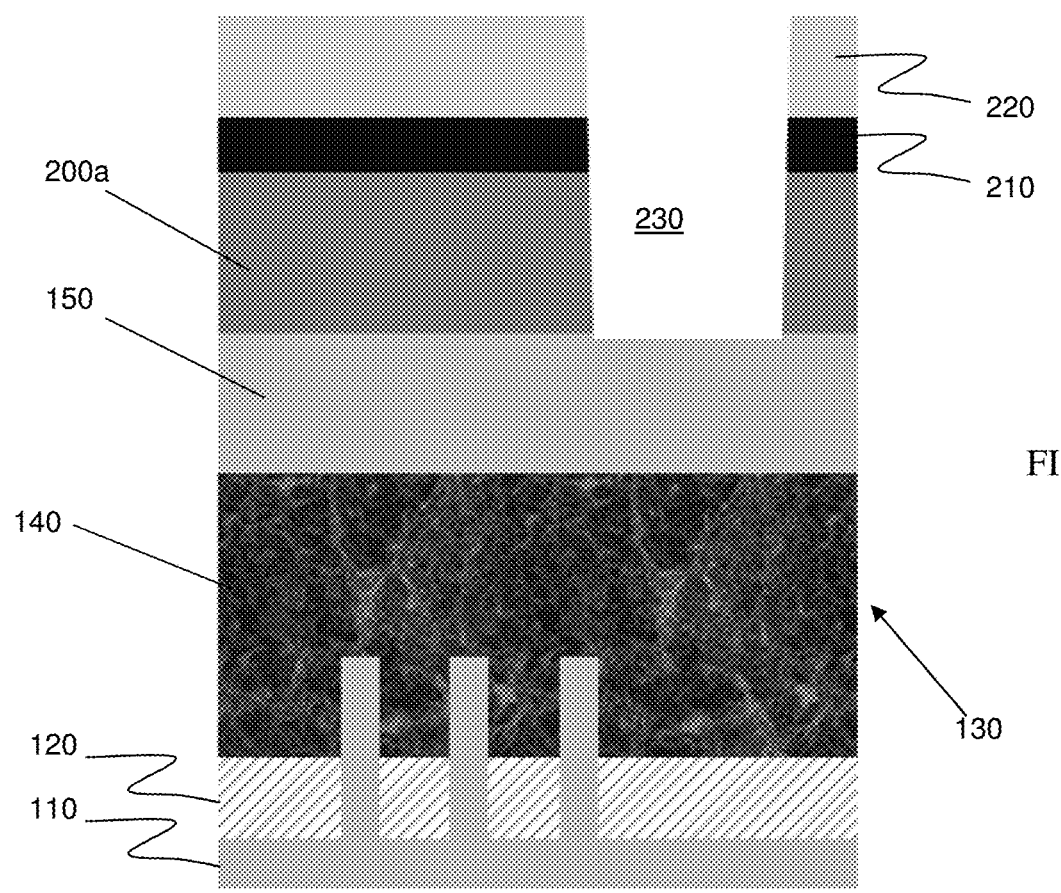

FIGS. 4A-4C show cross-sectional views of recessed S/D metallization features 180a. In embodiments, the contact metal of select S/D metallization features 180 are etched to form recesses 230a over select S/D metallization features 180, thereby forming recessed S/D metallization features 180a. In this way, the structures and processes described herein provide a scheme to only have recessed source/drain (S/D) metallization features 180a around the CBoA region 300, while other S/D metallization features 180 are not recessed.

By limiting the recessing to the S/D metallization features 180a which are around the CBoA region 300, the overall height of the S/D metallization features 180, 180a is increased, thereby reducing a spreading resistance provided by the S/D metallization features 180, 180a and also reducing a vertical resistance provided by S/D contacts to the S/D metallization features 180. The contact metal of the S/D metallization features 180 can be etched using selective etching processes to the contact metal, e.g., a wet etch process.

In embodiments, the recesses 230a can have a height in a range of about 10 nm to 30 nm. Further, the formation of the recesses 230a can cause an erosion (tapering) of sidewalls spacers 160 of the select gate structure 130a which is between the recessed S/D metallization features 180a, and other gate structures 130 which are adjacent to the recessed S/D metallization features 180a. In this way, a gate structure 130a between the recessed metallization features 180 has tapered spacers 160a. In embodiments, gate structures 130 of the plurality of gate structures 130 can also have tapered spacers 160a. Accordingly, similar to the spacers 160, the tapered spacers 160a are comprised of SiOCN.

Figure 5A:
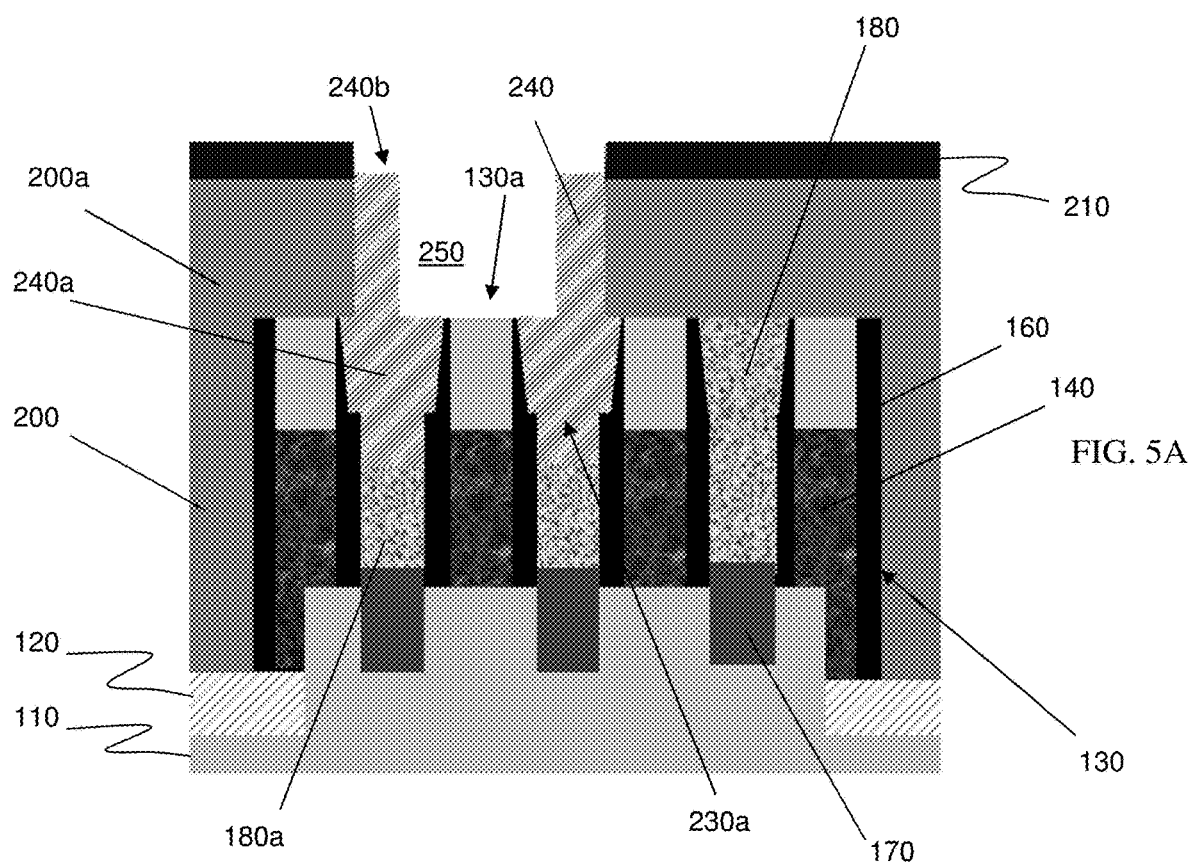
FIGS. 5A-5C show a dielectric fill, amongst other features, and respective fabrication processes in accordance with aspects of the present disclosure.
Figure 5B:
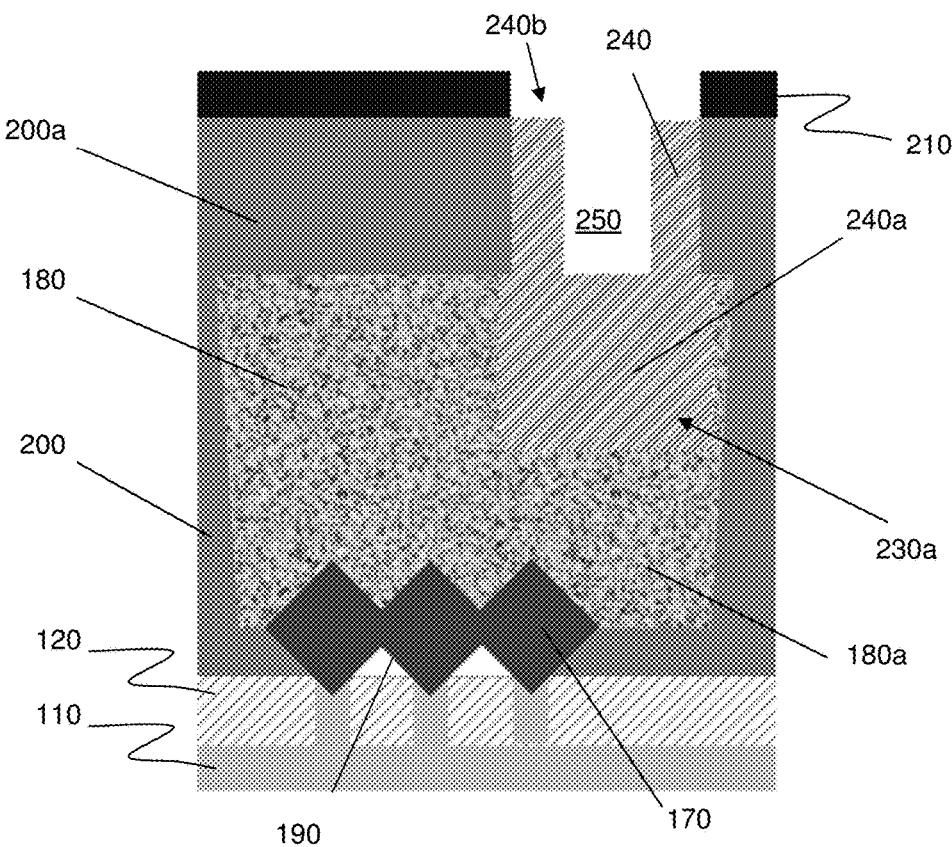
Figure 5C:
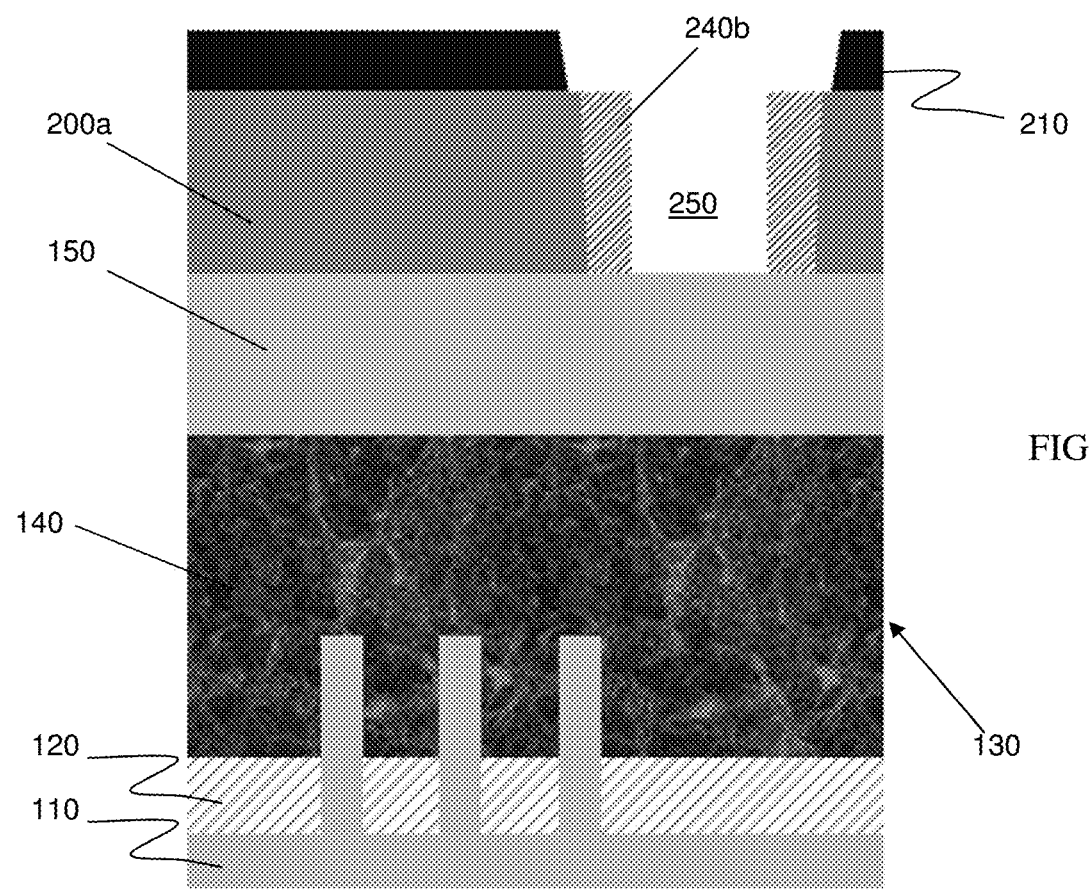

FIGS. 5A-5C show removal of the photoresist 220 and the deposition of a spacer material 240 over the recessed S/D metallization features 180a. In embodiments, the photoresist 220 can be removed by a conventional oxygen ashing process or other known stripants. The spacer material 240 is conformally deposited on the structure, e.g., deposited directly on the capping layer 210, on sidewalls of the capping layer 210 and the ILD layer 200a, and directly on the recessed S/D metallization features 180a and the gate structure 130a. In embodiments, the spacer material 240 can be deposited by a conventional blanket deposition process, e.g., CVD process. In embodiments, the spacer material 240 is a dielectric material and can be SiC, SiCO or $SiO_2$ as examples.

As shown in FIGS. 5A-5C, the spacer material 240 can pinch-off the recesses 230a over the recessed S/D metallization features 180a to form TS caps 240a. In this way, the recesses 230a are fully pinched-off over the recessed S/D metallization features 180a (the recessed TS region). More specifically, the dielectric cap (TS caps 240a) is pinched-off over the recessed metallization features 180a. In embodiments, airgaps can be present in the TS caps 240a.

The spacer material 240 undergoes an anisotropic etch to remove the spacer material 240 from surfaces of the capping layer 210 and the select gate structure 130a, to form the TS caps 240a and spacers 240b. Specifically, there is an etching of the spacer material 240 to form sidewall spacers 240b, which surround a gate contact. In this way, the sidewall spacers 240b of a gate contact are in direct contact with the dielectric caps, i.e., TS caps 240a. Further, the sidewalls spacers 240b and the dielectric caps are a same material. In embodiments, a trench 250 is between the spacers 240b.

In embodiments, the TS caps 240a and the spacers 240b will isolate the gate contact, further preventing shorts between the metallization features of the gate structures 130, 130a and the metallization features of the S/D regions 170. More specifically, the structures and processes described herein provide for dielectric spacers 240b surrounding a gate contact and which isolate the gate contact from the metallization features 180 and the recessed metallization features 180a. As shown in FIGS. 5A-5C, the anisotropic etching process will expose the gate cap 150 of the select gate structure 130a. Further, the anisotropic etching process will partially recess the spacer material 240 from sidewalls of the capping layer 210.

Figure 6A:
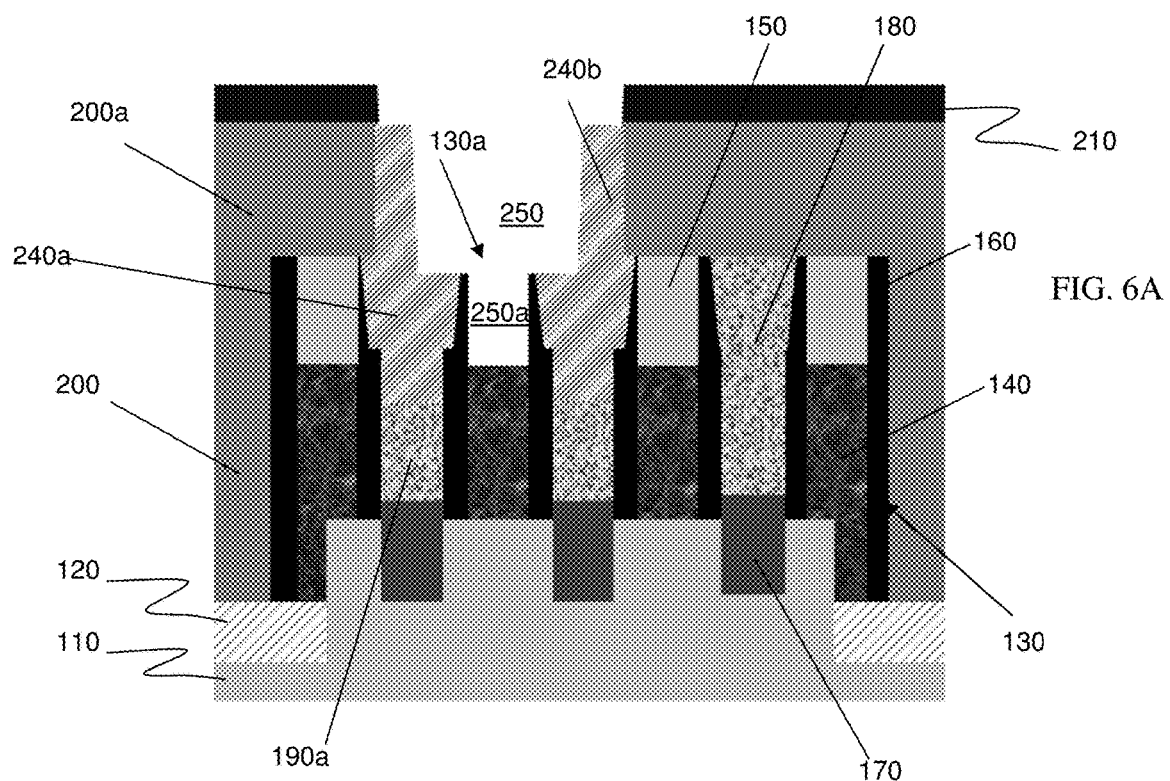
FIGS. 6A-6C show exposed gate materials, amongst other features, and respective fabrication processes in accordance with aspects of the present disclosure.
Figure 6B:
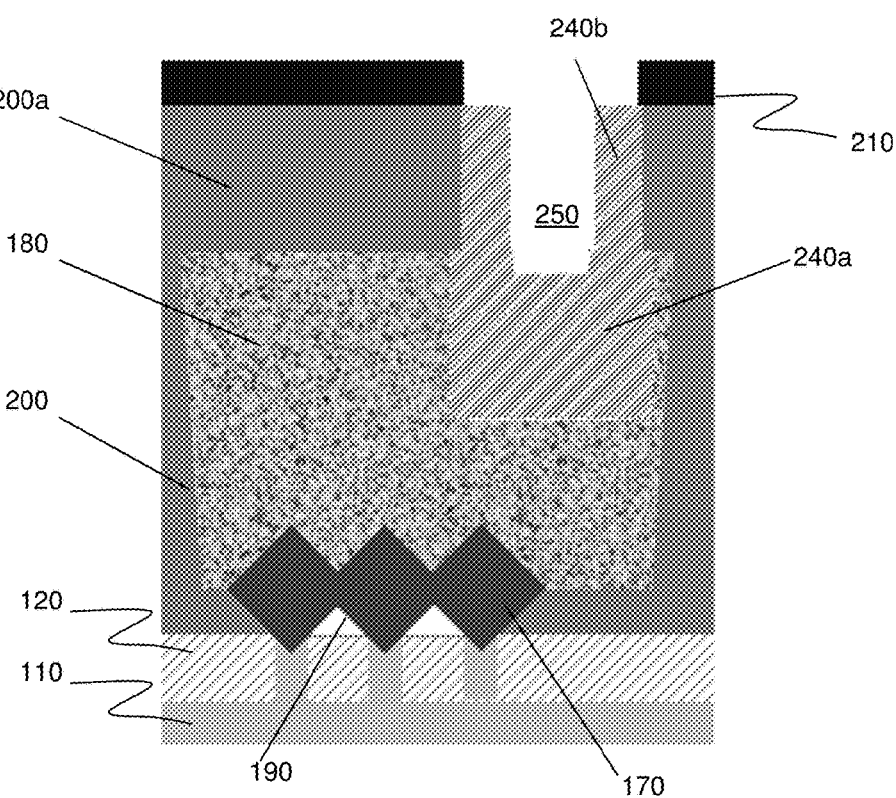
Figure 6C:
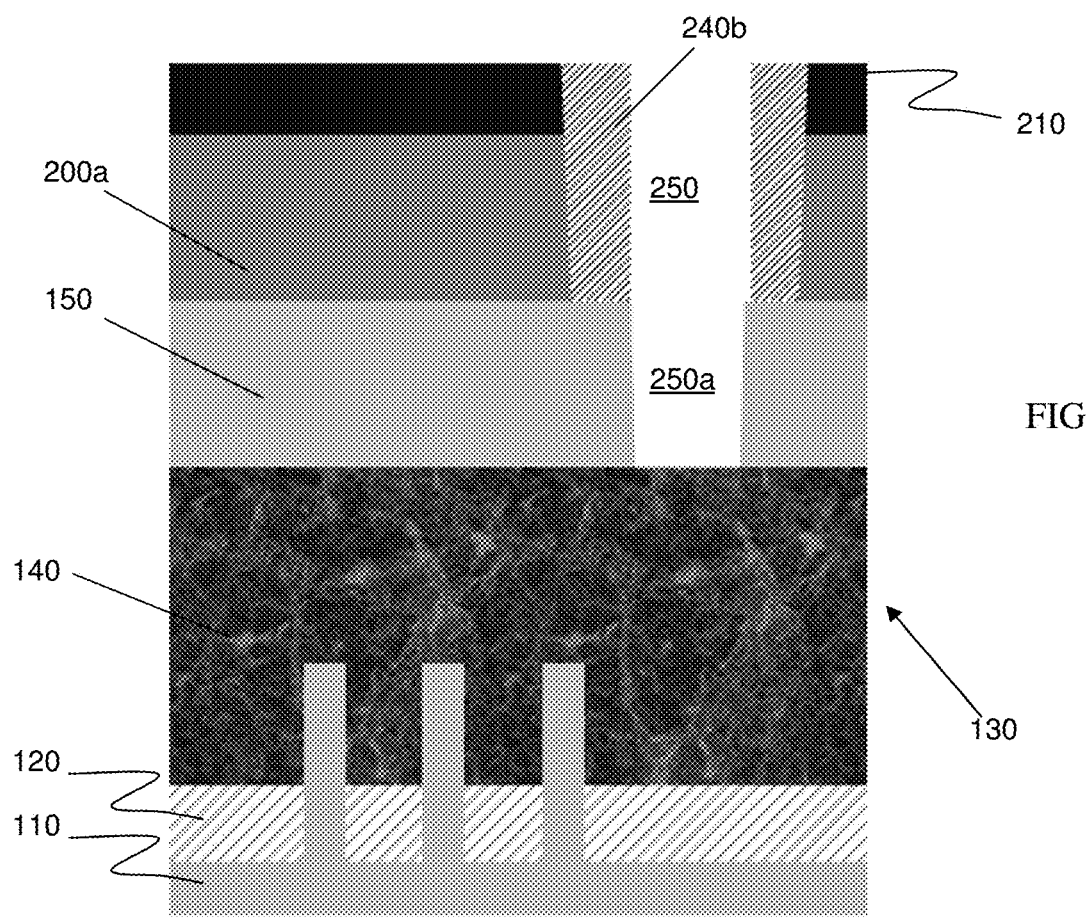

FIGS. 6A-6C show the removal of the gate cap 150 over the select gate structure 130a, thereby forming the recess 250a. The gate cap 150 can be removed by conventional selective etching processes, e.g., RIE process. Specifically, the etch process to remove the gate cap 150 is selective to the material of the gate cap 150. Different materials are contemplated herein for the gate cap 150 and the spacer material 240, as long as there is selectivity between the materials. The etching of the gate cap 150 of the select gate structure 130a is self-aligned with and exposes the gate materials 140 of the gate structure 130a. In embodiments, the recess 250a extends to below an upper surface of the sidewall spacer 20.

Figure 7A:
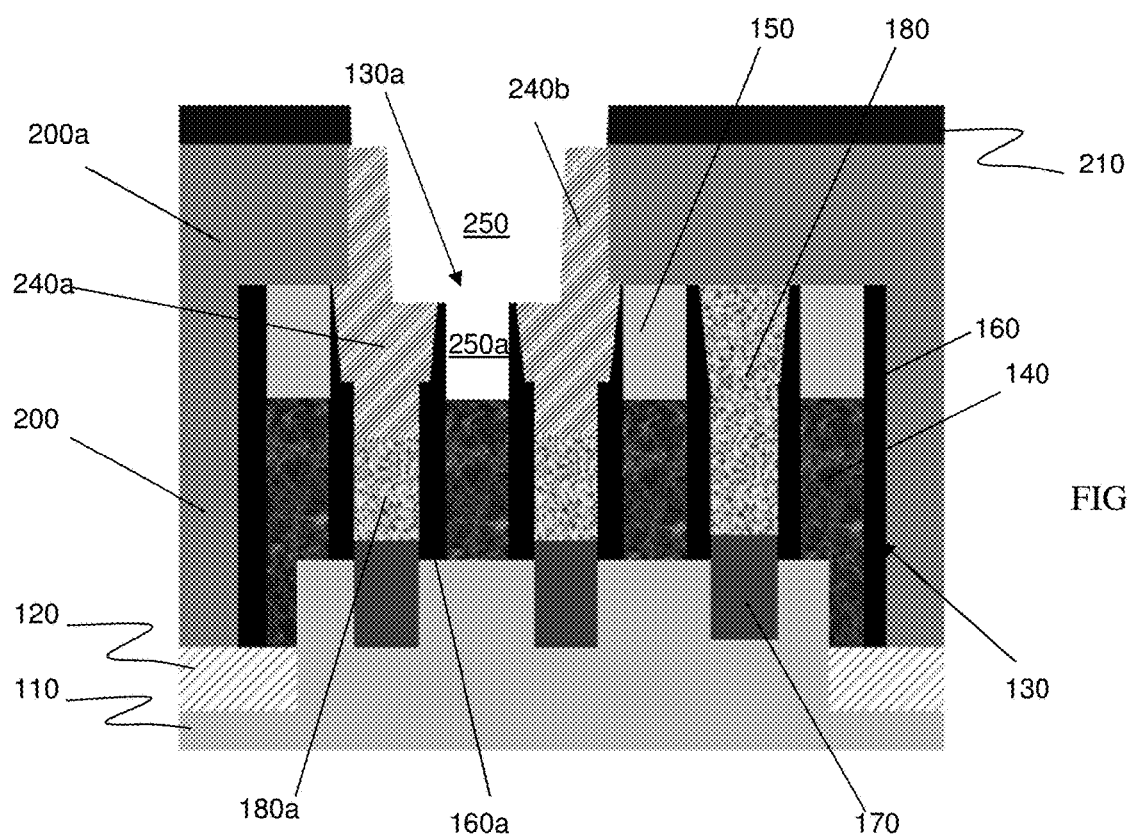
FIGS. 7A-7C show exposed metallization features, amongst other features, and respective fabrication processes in accordance with aspects of the present disclosure.
Figure 7B:
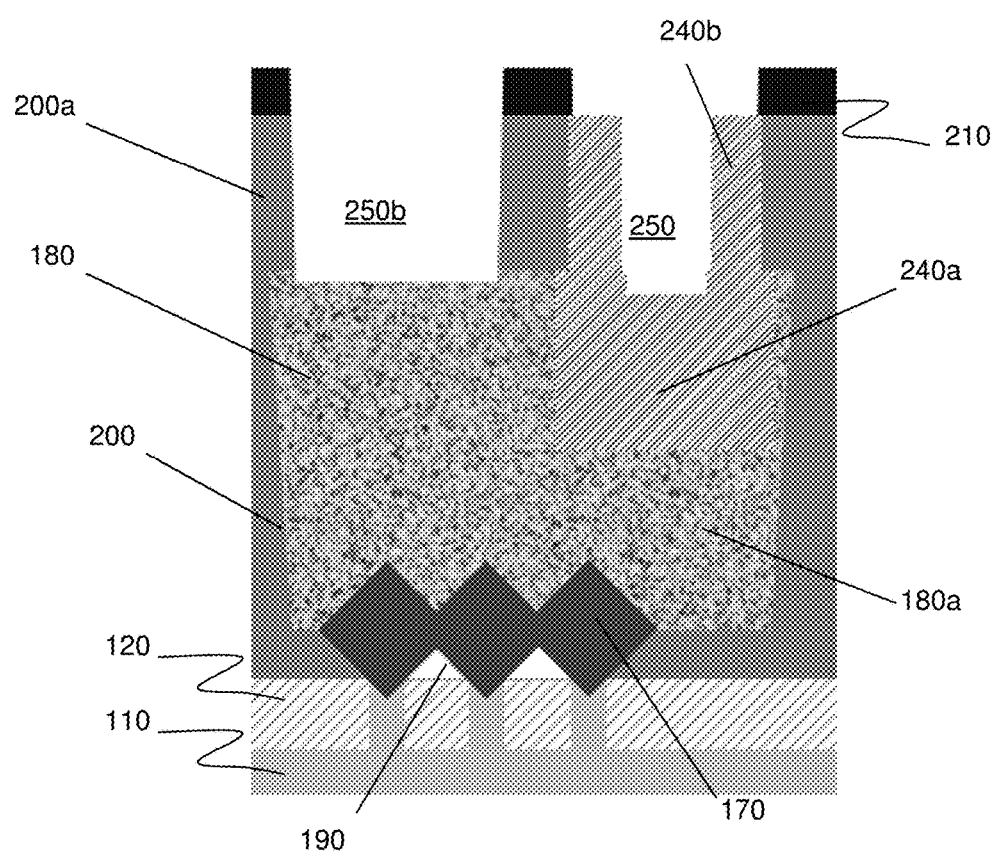
Figure 7C:
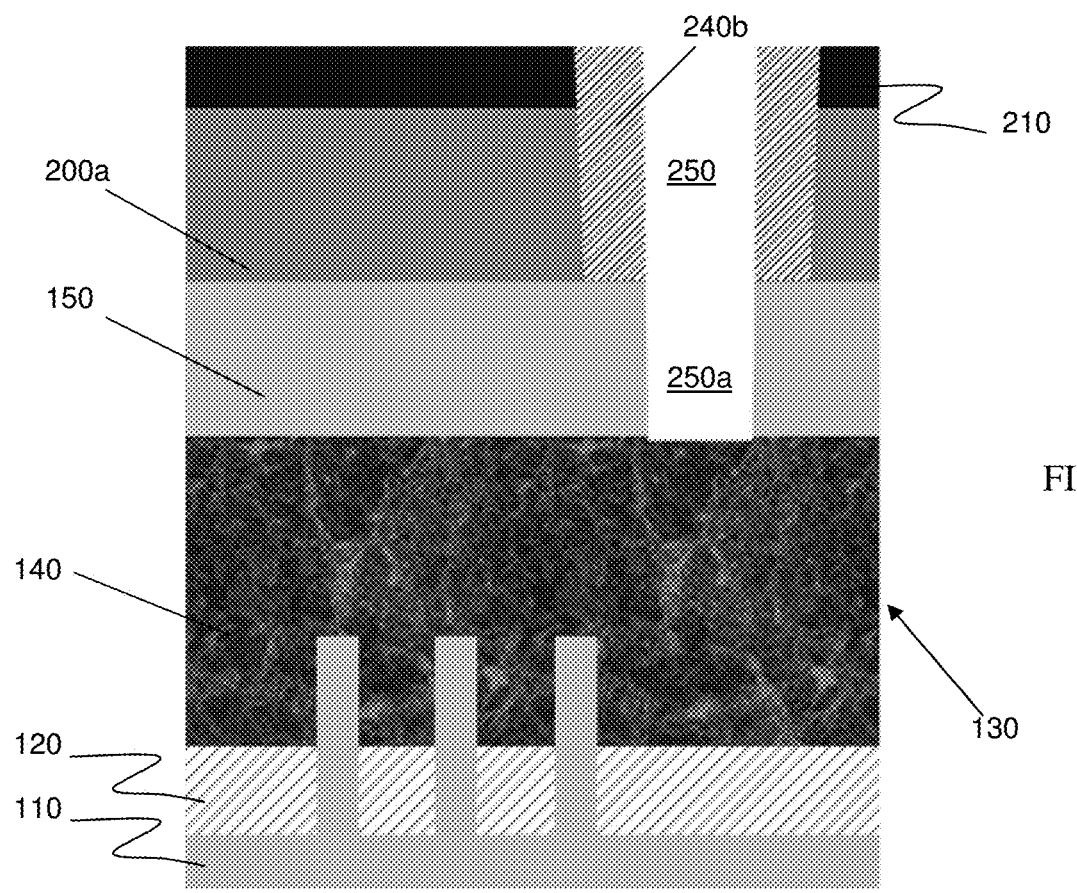

FIGS. 7A-7C show the formation of a recess 250b through the capping layer 210 and the ILD layer 200a, thereby exposing the contact metal of the S/D metallization features 180. In embodiments, the recess 250b can be formed by conventional lithography and etching processes, e.g., RIE.

Figure 8A:
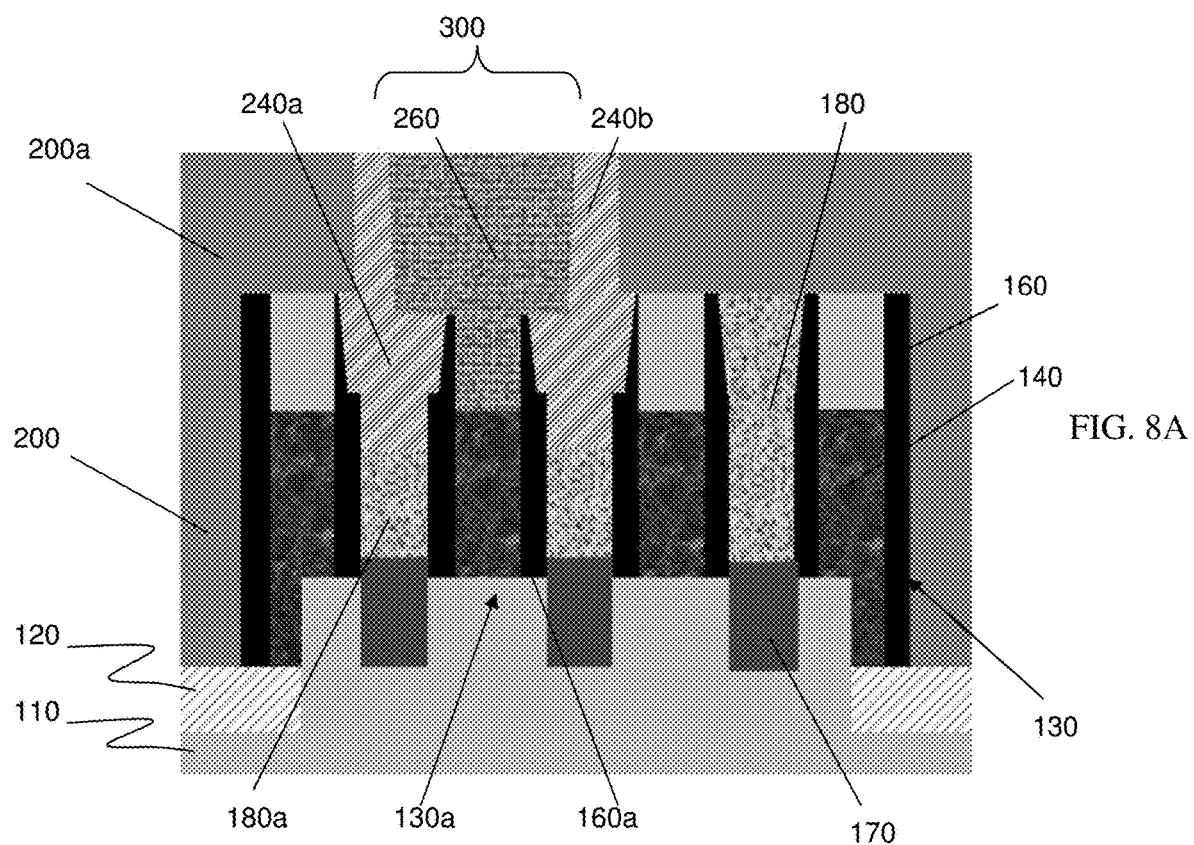
FIGS. 8A-8C show gate and source and drain contacts, amongst other features, and respective fabrication processes in accordance with aspects of the present disclosure.
Figure 8B:
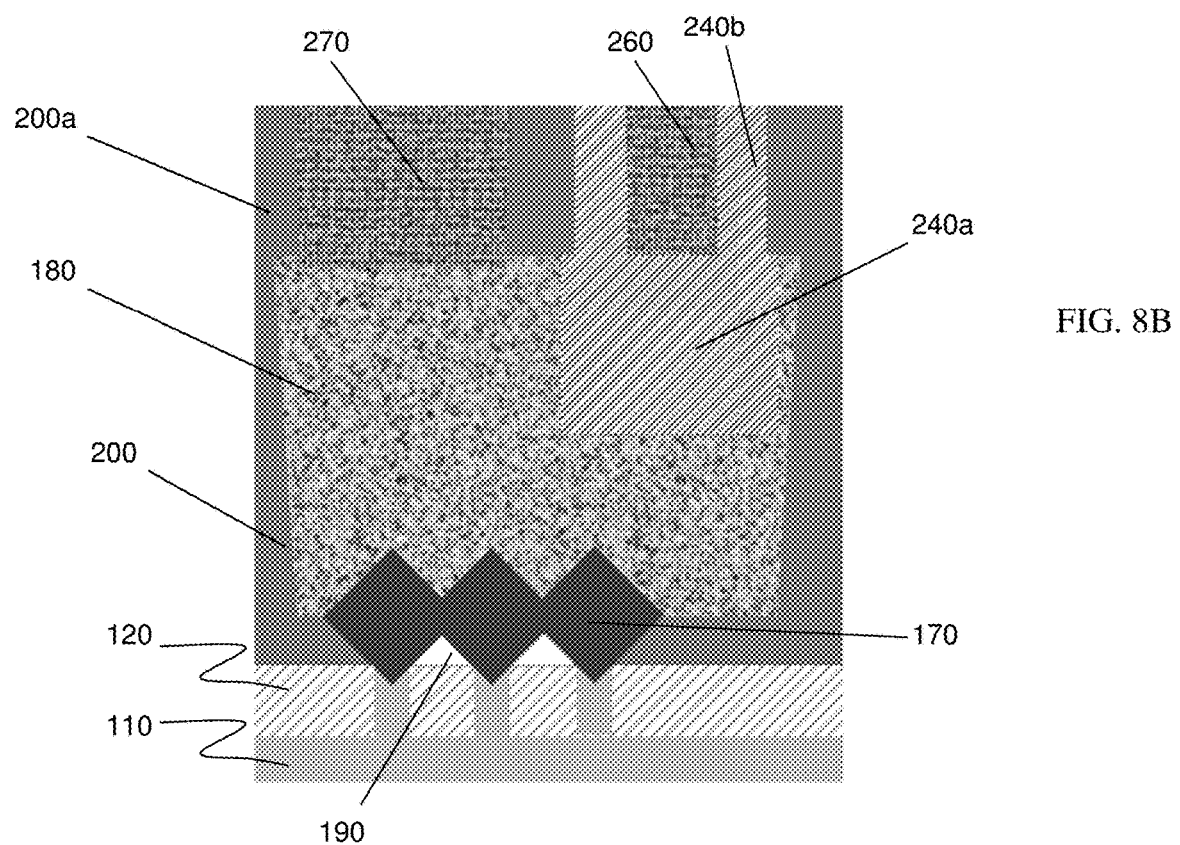
Figure 8C:
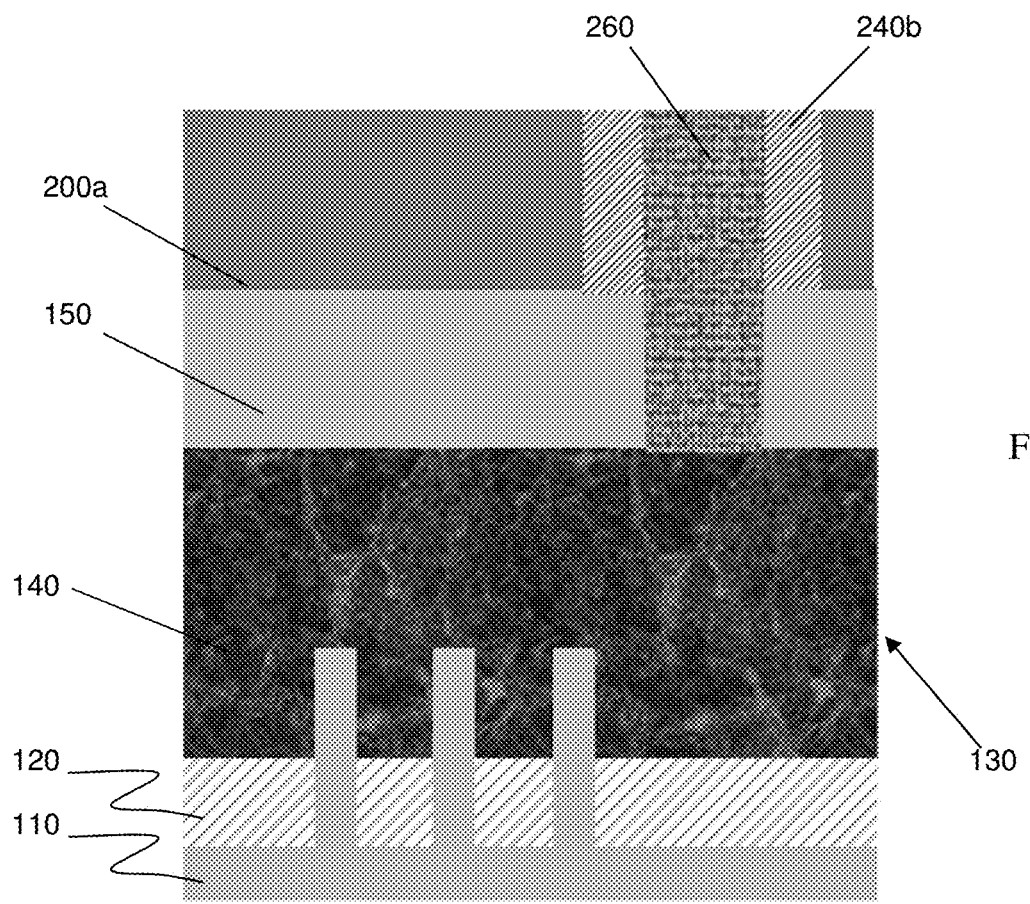

FIGS. 8A-8C show the formation of the gate contact 260 and the S/D contact 270 together at the same time, in accordance with aspects of the present disclosure. Specifically, the processes described herein provide for forming a source and drain contact 270 to remaining metallization features. In embodiments, the metal material for the gate contact 260 and the S/D contact 270 can be, e.g., Co, W, or Ru, deposited by a metal overfill process, followed by a CMP. Accordingly, the source and drain metallization features 180, 180a and the source and drain contacts 270 are of a same material.

By forming the gate contact 260 and the S/D contact 270 together, this is a self-aligned process for the gate contact 260 and the S/D contact 270. In this way, the structures and processes described herein provide for source and drain contacts 270 which are electrically contacting the metallization features 180 contacting the selected source and drain regions 170. The recessed metallization features 180a are below the gate contact 260. More specifically, the structures and processes described herein include a gate contact 260 which contacts a gate structure 130a between the recessed metallization features 180*a* and partially extends over the recessed metallization features 180*a*.

The gate contact 260 is over an active region to form the CBoA region 300. In this way, the structures and processes described herein comprise an active region, and the gate contact 300 is over the active region. In this way, a gate structure 130*a* includes an active region. As shown in FIGS. 8A-8C, the recessed S/D metallization features 180*a* are only around the CBoA region 300. Additionally, the TS caps 240*a* and the spacers 240*b* will isolate the gate contact 260, further preventing shorts between the metallization features of the gate structures 130, 130*a* and the metallization features of the S/D regions 170, i.e., S/D metallization features 180, 180*a* and the S/D contact 270. More specifically, there is a dielectric cap, i.e., TS caps 240*a*, over the recessed metallization features 180*a*, and the dielectric cap isolating the gate contact 260 from the recessed metallization features 180*a*.

Accordingly, the structures described herein provide for a plurality of gate structures 130; source and drain regions 170 adjacent to respective gate structures 130 of the plurality of gate structures 130; metallization features 180 contacting selected source and drain regions 130; and recessed metallization features 180*a* contacting other selected source and drain regions 170. Further, the structures and processes described herein provide for a gate contact 260 contacting a gate structure 130*a* between the recessed metallization features 180*a*.

It should now be understood that the processes and resultant structures described herein will serve to further ensure device performance during fabrication processes for smaller technology nodes. Advantageously, by limiting the recessing to S/D metallization features which are around the CBoA region, the overall height of the S/D metallization features is increased, thereby reducing a spreading resistance provided by the S/D metallization features, and also reducing a vertical resistance provided by the S/D contact to the S/D metallization features. Further, the dielectric cap over the recessed S/D metallization features and sidewall spacers which surround the gate contact provide further isolation of the gate contact from the metallization features of the S/D regions, thereby preventing shorts.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a plurality of gate structures;
   source and drain regions adjacent to respective gate structures of the plurality of gate structures;
   metallization features contacting selected source and drain regions;
   recessed metallization features contacting other selected source and drain regions; and
   a gate contact contacting a gate structure between the recessed metallization features.

2. The structure of claim 1, further comprising an active region, wherein the gate contact is over the active region.

3. The structure of claim 2, further comprising a dielectric cap over the recessed metallization features, the dielectric cap isolating the gate contact from the recessed metallization features.

4. The structure of claim 3, wherein the dielectric cap is pinched-off over the recessed metallization features.

5. The structure of claim 4, further comprising dielectric spacers surrounding the gate contact and which isolate the gate contact from the metallization features and the recessed metallization features.

6. The structure of claim 5, wherein the recessed metallization features are below the gate contact.

7. The structure of claim 1, further comprising source and drain contacts which are electrically contacting the metallization features contacting the selected source and drain regions.

8. The structure of claim 7, wherein the source and drain metallization features and the source and drain contacts are of a same material.

9. The structure of claim 1, wherein the gate structure between the recessed metallization features comprises tapered spacers.

10. The structure of claim 9, wherein the tapered spacers are comprised of SiOCN.

11. A structure comprising:
    a plurality of gate structures;
    source and drain regions adjacent to respective gate structures of the plurality of gate structures;
    metallization features contacting selected source and drain regions; and
    recessed metallization features contacting other selected source and drain regions,
    wherein a gate structure between the recessed metallization features comprises tapered spacers.

12. The structure of claim 11, wherein the tapered spacers are comprised of SiOCN.

13. The structure of claim 11, further comprising source and drain contacts which are electrically contacting the metallization features contacting the selected source and drain regions.

14. The structure of claim 13, wherein the source and drain metallization features and the source and drain contacts are of a same material.

15. A structure comprising:
    a plurality of gate structures;
    source and drain regions adjacent to respective gate structures of the plurality of gate structures;
    metallization features contacting selected source and drain regions; and recessed metallization features contacting other selected source and drain regions, further comprising a gate contact which contacts a gate structure between the recessed metallization features and partially extends over the recessed metallization features.

16. The structure of claim 15, further comprising an active region, wherein the gate contact is over the active region.

17. The structure of claim 16, further comprising a dielectric cap over the recessed metallization features, the dielectric cap isolating the gate contact from the recessed metallization features.

18. The structure of claim 17, wherein the dielectric cap is pinched-off over the recessed metallization features.

19. The structure of claim 18, further comprising dielectric spacers surrounding the gate contact and which isolate the gate contact from the metallization features and the recessed metallization features.

20. The structure of claim 19, wherein the recessed metallization features are below the gate contact, and wherein the dielectric cap and the dielectric spacers are composed of SiC, SiCO or $SiO_2$.

\* \* \* \* \*